(12) United States Patent
Nam

(10) Patent No.: US 6,803,308 B2
(45) Date of Patent: Oct. 12, 2004

(54) METHOD OF FORMING A DUAL DAMASCENE PATTERN IN A SEMICONDUCTOR DEVICE

(75) Inventor: Sang-Woo Nam, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/704,966

(22) Filed: Nov. 12, 2003

(65) Prior Publication Data
US 2004/0121578 A1 Jun. 24, 2004

(30) Foreign Application Priority Data
Dec. 24, 2002 (KR) .................. 10-2002-0083525

(51) Int. Cl.⁷ .......................................... H01L 21/4763
(52) U.S. Cl. .................. 438/638; 438/646; 438/632; 438/698; 438/725; 438/760
(58) Field of Search .................. 438/632, 637, 438/638, 646, 694, 695, 698, 725, 760

(56) References Cited

U.S. PATENT DOCUMENTS

| | | |
|---|---|---|
| 5,935,762 A | 8/1999 | Dai et al. |
| 6,265,306 B1 * | 7/2001 | Starnes et al. .............. 438/632 |
| 6,458,689 B2 | 10/2002 | Yu et al. |
| 6,589,881 B2 | 7/2003 | Huang et al. |

* cited by examiner

*Primary Examiner*—Jack Chen
(74) *Attorney, Agent, or Firm*—Pillsbury Winthrop LLP

(57) ABSTRACT

The present invention is directed to a method of forming a dual damascene pattern in a fabrication process of a semiconductor device, which is capable of simplifying a fabrication process of a semiconductor device by filling a via hole with a photoresist, using a reflow phenomenon of the photoresist, in an ashing process.

20 Claims, 4 Drawing Sheets

METHOD OF FORMING A DUAL DAMASCENE PATTERN IN A SEMICONDUCTOR DEVICE

BACKGROUND OF THE INVENTION (a) Field of the Invention

The present invention relates to a method of forming a dual damascene pattern in a fabrication process of a semiconductor device, and more particularly to a method of forming a dual damascene pattern of a semiconductor device, which is capable of simplifying a fabrication process of a semiconductor device by filling a via hole with a photoresist, using a reflow phenomenon of the photoresist, in an ashing process after the via hole is formed.

(b) Description of the Related Art

Conventional methods of forming a dual damascene pattern in a fabrication process of a semiconductor device include a step of applying a first photoresist having a window of a prescribed size to function as a mask on a top surface of the semiconductor substrate on which a copper wire, a first nitride film, a first interlayer dielectric, a second nitride film, and a second interlayer dielectric are formed in order, a step of forming via holes by etching a region of the semiconductor substrate corresponding to the window of the first photoresist up to a nitride film using a dry or wet etching process, a step of removing a photoresist by ashing the photoresist at a high temperature in an ashing equipment, a step of filling the via holes with the second photoresist or an organic ARC (anti-reflection coating) in a photo track equipment, a step of applying a third photoresist functioning as a mask and having a window larger than the via holes on an interlayer dielectric, a step of forming metal line hollows by etching a region of the semiconductor substrate corresponding to the window of the third photoresist up to a nitride film using a dry or wet etching process, and a step of removing the third photoresist by ashing the third photoresist at a high temperature.

Here, the reason for filling the via holes with the second photoresist or the organic ARC in the photo track equipment is that contamination of a lower copper wire layer is prevented and a metal line hollow profile makes good.

However, in the conventional dual damascene pattern formation methods, since the via holes are formed, the first photoresist as the mask of the via holes is completely removed in the ashing equipment, and then the via holes are filled with the second photoresist or the organic ARC in the photo track equipment, the number of fabrication processes unnecessarily are increased, which results in increase of probability of contamination of the semiconductor device.

In addition, a problem arises in that voids frequently occur as the via holes are not completely filled with a photoresist in the photo track equipment.

Conventional techniques related to the dual damascene process as described above are disclosed in U.S. Pat. Nos. 6,589,881, 6,458,689, and 5,935,762.

SUMMARY OF THE INVENTION

In considerations of the above problems, it is an object of the present invention to simplify a fabrication process of a semiconductor device.

Another object of the present invention is to prevent occurrence of voids when via holes are filled with a photoresist.

Still another object of the present invention is to fill via holes with a photoresist using a reflow phenomenon of the photoresist.

To achieve the objects, according to an aspect of the present invention, a method of forming an interlayer dielectric on a structure of a semiconductor substrate; forming a first photoresist having a first window of a predetermined width on the interlayer dielectric; forming via holes by etching the interlayer dielectric exposed through the first window using the first photoresist as a mask; filling the via holes with the first photoresist by reflowing the first photoresist and removing the first photoresist on the interlayer dielectric, in an ashing process to raise an atmosphere temperature; forming a second photoresist having a second window of a width larger than that of the first window and exposing the first photresist and a portion of the interlayer dielectric through the second window on the interlayer dielectric; forming metal line hollows by etching the interlayer dielectric and the first photoresist exposed through the second window up to a depth shallower than that of the via holes using the second photoresis as a mask; and removing residual first and second photoresists.

Preferably, in the ashing process, a step of filling the via holes with the first photoresist by reflowing the first photoresist and a step of removing the first photoresist on the interlayer dielectric is performed sequentially or simultaneously.

Preferably, when a step of filling the via holes with the first photoresist by reflowing the first photoresist and a step of removing the first photoresist on the interlayer dielectric is performed simultaneously, the ashing process is performed under the conditions where a duration is 10 to 40 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000 W.

Preferably, in the ashing process, a first step of removing a polymer generated in the step of forming the via holes, a second step of filling the via holes with the first photoresist by reflowing the first photoresist, a third step of removing the first potoresist on remaining interlayer dielectric except the filling first photoresist are performed sequentially.

Preferably, the first step of removing the polymer generated in the step of forming the via holes is performed under the conditions where a duration is 3 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

Preferably, the second step of filling the via holes with the first photoresist by reflowing the first photoresist is performed under the conditions where a duration is 10 to 200 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 0W.

Preferably, the third step of removing the first photoresist on remaining interlayer dielectric except the filling first photoresist is performed under the conditions where a duration is 5 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

Preferably, the interlayer dielectric includes a first etch stop layer, a first dielectric, a second etch stop layer and a second dielectric, wherein, in the step of forming the via holes, the first etch stop layer is exposed by etching the second dielectric, the second etch stop layer and the first dielectric, and wherein, in the step of forming the metal line hollows, the second etch stop layer is exposed by etching the second dielectric.

Preferably, the first etch stop layer and the second etch stop layer are a nitride layer.

Preferably, the uppermost layer of the structure of the semiconductor substrate is a copper wire layer.

Preferably, in the step of removing the residual first and second photoresists, the residual first and second photoresists are removed by combustion.

Preferably, in the step of forming the via holes and the step of forming the metal line hollows, the interlayer dielectric and the first photoresist are dry or wet etched.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings, so that those skilled in the art to which the present invention belongs can practice the present invention easily.

FIGS. 1a to 1g are sectional views sequentially showing a method of forming a dual damascene pattern of a semiconductor device according to an embodiment of the present invention.

A dual damascene pattern in the present invention is referred to as a pattern in which both of metal line hollows and via holes are formed in a dual damascene process where the metal line hollows and the via holes are filled with metal material such as copper after both of the metal line hollows and the via holes in which a metal wire is be formed are formed.

Figure 1A:
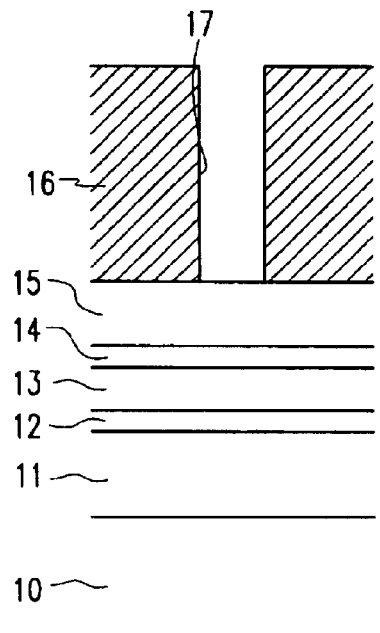
FIGS. 1a to 1g are sectional views showing a method of forming a dual damascene pattern in a fabrication method of a semiconductor device according to the present invention.

First, as shown in FIG. 1a, a interlayer dielectric is formed on a structure 10 of a semiconductor substrate on the uppermost layer of which a lower metal wire 11 is formed, and a first photoresist 16 having a first window 17 of a prescribed size and functioning as a mask is applied on the interlayer dielectric.

At this time, copper can be employed as the metal wire 11 and an etch stop layer can be formed in the interlayer dielectric.

The etch stop layer includes a first etch stop layer 12 and a second etch stop layer 14 inserted in an dielectric and used as etch stop layers in an etching process for forming via holes and metal line hollows. In this case, the first etch stop layer 12, a first interlayer dielectric 13, the second etch stop layer 14, and a second interlayer dielectric 15 can be sequentially formed. As an etch stop layer, material with a etching speed slower than that of an interlayer dielectric, for example, a nitride layer, can be used.

Figure 1B:
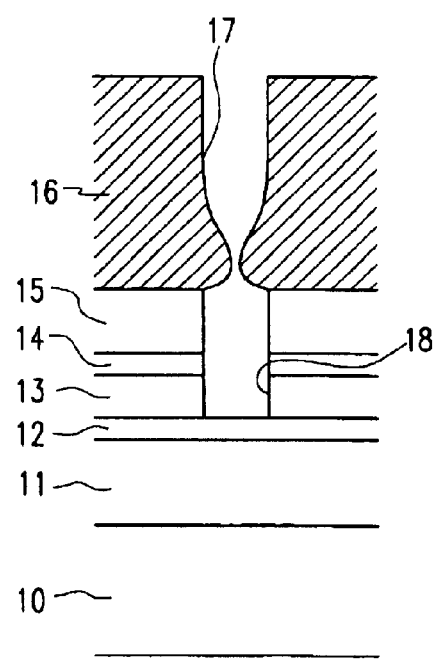

Next, as shown in FIG. 1b, a dry or wet etching process is performed using the first nitride layer 12 as an etch stop layer to thereby form a via hole 18 by removing the second interlayer dielectric 15, the second nitride layer 14 and the first interlayer dielectric 13 exposed through the first window of the first photoresist 16 and exposing the first nitride layer 12.

Figure 1C:
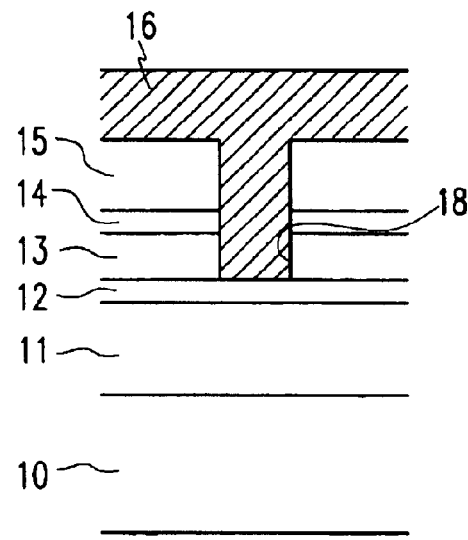
Figure 1D:
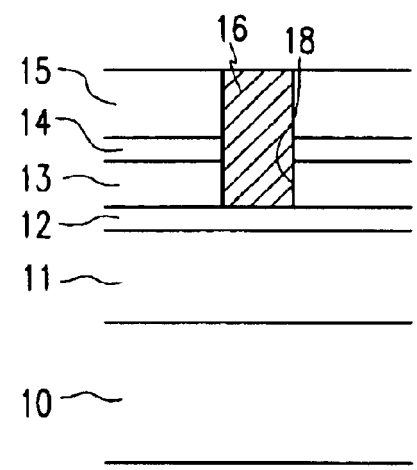

Subsequently, by performing an ashing process to raise an atmosphere temperature, the first photoresist 16 reflows so that the via hole 18 is filled with the first photoresist 16 as shown in FIG. 1c, and then the first photoresist 16 on the second interlayer dielectric 15 is removed as shown in FIG. 1d.

At this time, a step of filling the via hole 18 with the first photoresist 16 by reflowing the first photoresist 16 and a step of removing the first photoresist 16 on the second interlayer dielectric 15 can be sequentially or simultaneously performed.

In the ashing process, after oxygen is injected and nitrogen is selectively injected, the first photoresist 16 is heated at a high temperature such that a temperature is adjusted to have a constant range, a pressure is adjusted to have a constant range, a power is applied during a prescribed duration. At this time, process parameters such as the temperature, the pressure, injections of the oxygen, the nitrogen, the power, and the duration are adjustable depending on the purpose of the ashing process.

As an example, when a step of filling the via hole 18 with the first photoresist 16 by reflowing the first photoresist and a step of removing the first photoresist 16 on the second interlayer dielectric 15 is performed simultaneously, the ashing process is performed under the conditions where a duration is 10 to 40 seconds, a temperature is 150 to 30° C., a pressure is 0.5 to 5 Torr, a injection of $O_2$ is 500 to 10000 ions/cm$^2$, a injection of $N_2$ is less than 1000 ions/cm$^2$, and a power is 200 to 2000W. At this time, a polymer generated in the step of forming the via hole is removed together.

As another example, when a step of filling the via hole 18 with the first photoresist 16 by reflowing the first photoresist and a step of removing the first photoresist 16 on the second interlayer dielectric 15 is performed sequentially, a first step of removing the polymer generated in the step of forming the via hole is performed under the conditions where a duration is 3 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W, and a second step of filling the via hole with the first photoresist by reflowing the first photoresist is performed under the conditions where a duration is 10 to 200 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 0W, and then a third step of removing the first potoresist on remaining interlayer the interlayer dielectric except the filling first photoresist is performed under the conditions where a duration is 5 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

Figure 1E:
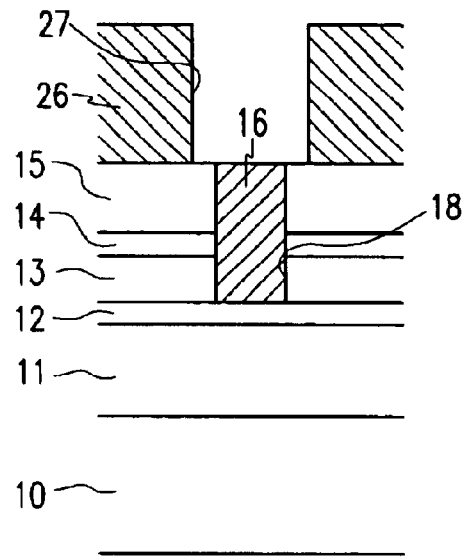

Next, as shown in FIG. 1e, a second photoresist 26 having a second window 27 of a width larger than that of the first window 17 and exposing the first photresist 16 and a portion of the second interlayer dielectric 15 through the second window 27 is formed on the portion of the second interlayer dielectric.

Figure 1F:
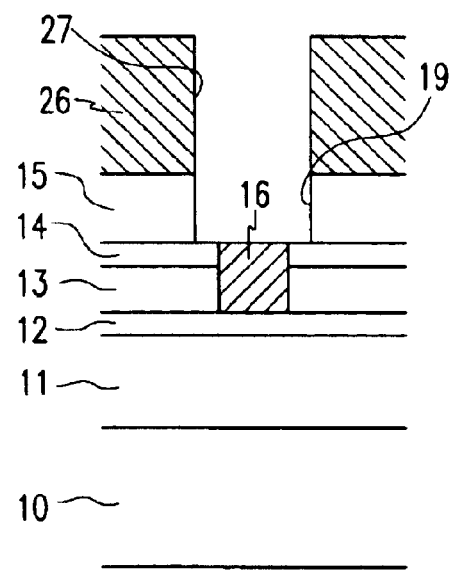

Next, as shown in FIG. 1f, by performing a dry or wet etching process using the second nitride layer 14 as the etch stop layer, the second interlayer dielectric 15 exposed through the second window 27 of the second photoresist 26 is removed and the second nitride layer 14 is exposed to form a metal line hollow 19 of a depth shallower than that of the via hole 18.

Figure 1G:
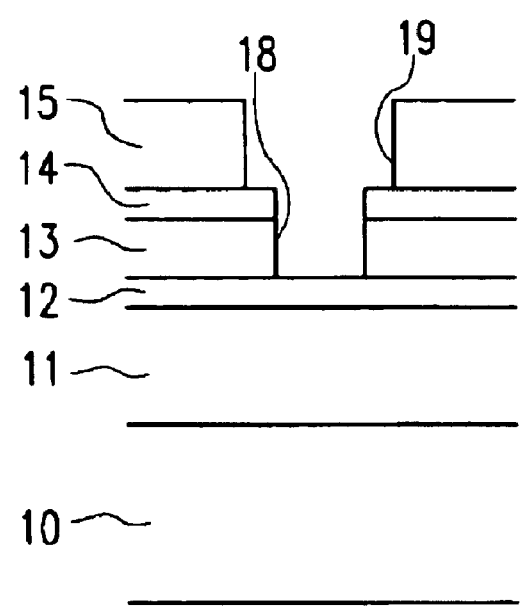

Finally, as shown in FIG. 1g, by performing an ashing process at a high temperature, residual first 16 and second 26 photoresists are removed by combustion.

As apparent from the above description, by the method of forming the dual damascene pattern in the fabrication process of the semiconductor device according to the present invention, the number of fabrication processes and the probability of contamination of the semiconductor device can be significantly reduced by forming the via hole, and then filling the via hole with the photoresist using the reflow of the photoresist before completely removing the photoresist as the mask of the via hole in the ashing equipment.

In addition, by filling the via hole with the photoresist by naturally reflowing the photoresist in the ashing equipment, there are no void in the filling photoresist, which results in complete filling of the via hole with the photoresist.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of forming a dual damascene pattern in a semiconductor device comprising the steps of:
    forming an interlayer dielectric on a structure of a semiconductor substrate;
    forming a first photoresist having a first window of a predetermined width on the interlayer dielectric;
    forming via holes by etching the interlayer dielectric exposed through the first window using the first photoresist as a mask;
    filling the via holes with the first photoresist by reflowing the first photoresist and removing the first photoresist on the interlayer dielectric, in an ashing process to raise an atmosphere temperature;
    forming a second photoresist having a second window of a width larger than that of the first window and exposing the first photresist and a portion of the interlayer dielectric through the second window on the interlayer dielectric;
    forming metal line hollows by etching the interlayer dielectric and the first photoresist exposed through the second window up to a depth shallower than that of the via holes using the second photoresis as a mask; and
    removing residual first and second photoresists.

2. The method of claim 1, wherein, in the ashing process, a step of filling the via holes with the first photoresist by reflowing the first photoresist and a step of removing the first photoresist on the interlayer dielectric is performed simultaneously.

3. The method of claim 2, wherein the ashing process is performed under the conditions where a duration is 10 to 40 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

4. The method of claim 1, wherein, in the ashing process, a step of filling the via holes with the first photoresist by reflowing the first photoresist and a step of removing the first photoresist on the interlayer dielectric is performed sequentially.

5. The method of claim 1, wherein, in the ashing process, a first step of removing a polymer generated in the step of forming the via holes, a second step of filling the via holes with the first photoresist by reflowing the first photoresist, a third step of removing the first potoresist on remaining interlayer dielectric except the filling first photoresist are performed sequentially.

6. The method of claim 5, wherein the first step of removing the polymer generated in the step of forming the via holes is performed under the conditions where a duration is 3 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

7. The method of claim 5, wherein the second step of filling the via holes with the first photoresist by reflowing the first photoresist is performed under the conditions where a duration is 10 to 200 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 0W.

8. The method of claim 5, wherein the third step of removing the first photoresist on remaining interlayer dielectric except the filling first photoresist is performed under the conditions where a duration is 5 to 20 seconds, a temperature is 150 to 30° C., a pressure is 0.5 to 5 Torr, a injection of $O_2$ is 500 to 10000 ions/cm$^2$, a injection of $N_2$ is less than 1000 ions/cm$^2$; and a power is 200 to 2000W.

9. The method of claim 1, wherein, in the ashing process, a step of filling the via holes with the first photoresist by reflowing the first photoresist and a step of removing the first photoresist on the interlayer dielectric is performed simultaneously under the conditions where a duration is 10 to 40 seconds, a temperature is 150 to 30° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

10. The method of claim 9, wherein the interlayer dielectric includes a first etch stop layer, a first dielectric, a second etch stop layer and a second dielectric,
    wherein, in the step of forming the via holes, the first etch stop layer is exposed by etching the second dielectric, the second etch stop layer and the first dielectric, and
    wherein, in the step of forming the metal line hollows, the second etch stop layer is exposed by etching the second dielectric.

11. The method of claim 10, wherein the first etch stop layer and the second etch stop layer are a nitride layer.

12. The method of claim 1, wherein the ashing process includes
    a first step of removing a polymer generated in the step of forming the via holes under the conditions where a duration is 3 to 20 seconds, a temperature is 150 to 30° C., a pressure is 0.5 to 5 Torr, a injection of $O_2$ is 500 to 10000 ions/cm$^2$, a injection of $N_2$ is less than 1000 ions/cm$^2$, and a power is 200 to 2000W;
    a second step of filling the via holes with the first photoresist by reflowing the first photoresist under the conditions where a duration is 10 to 200 seconds, a temperature is 150 to 30° C., a pressure is 0.5 to 5 Torr, a injection of $O_2$ is 500 to 10000 ions/cm$^2$, a injection of $N_2$ is less than 1000 ions/cm$^2$, and a power is 0W; and
    a third step of removing the first potoresist on remaining interlayer dielectric except the filling first photoresist under the conditions where a duration is 5 to 20 seconds, a temperature is 150 to 300° C., a pressure is 0.5 to 5 Torr, a injection of $O_2$ is 500 to 10000 ions/cm$^2$, a injection of $N_2$ is less than 1000 ions/cm$^2$, and a power is 200 to 2000W.

13. The method of claim 12, wherein the interlayer dielectric includes a first etch stop layer, a first dielectric, a second etch stop layer and a second dielectric, wherein, in the step of forming the via holes, the first etch stop layer is exposed by etching the second dielectric, the second etch stop layer and the first dielectric, and wherein, in the step of forming the metal line hollows, the second etch stop layer is exposed by etching the second dielectric.

14. The method of claim 13, wherein the first etch stop layer and the second etch stop layer are a nitride layer.

15. The method of claim 1, wherein the uppermost layer of the structure of the semiconductor substrate is a copper line.

16. The method of claim 1, wherein the interlayer dielectric includes a first etch stop layer, a first dielectric, a second etch stop layer and a second dielectric, wherein, in the step of forming the via holes, the first etch stop layer is exposed by etching the second dielectric, the second etch stop layer and the first dielectric, and wherein, in the step of forming the metal line hollows, the second etch stop layer is exposed by etching the second dielectric.

17. The method of claim 16, wherein the first etch stop layer and the second etch stop layer are a nitride layer.

18. The method of claim 1, wherein, in the step of removing the residual first and second photoresists, the residual first and second photoresists are removed by combustion.

19. The method of claim 1, wherein, in the step of forming the via holes, the interlayer dielectric is dry or wet etched.

20. The method of claim 1, wherein, in the step of forming the metal line hollows, the interlayer dielectric and the first photoresist are dry or wet etched.

* * * * *